United States Patent
Komiyama

(10) Patent No.: US 6,582,296 B2
(45) Date of Patent: Jun. 24, 2003

(54) VENTILATING METHOD AND VENTILATING SYSTEM FOR SEMICONDUCTOR MANUFACTURING APPARATUSES

(75) Inventor: Kiyoshi Komiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 20 days.

(21) Appl. No.: 09/873,101

(22) Filed: Dec. 20, 2000

(65) Prior Publication Data

US 2001/0044161 A1 Nov. 22, 2001

(30) Foreign Application Priority Data

Dec. 21, 1999 (JP) .......................................... 11-362156

(51) Int. Cl.[7] ................................................. F24F 3/16
(52) U.S. Cl. ..................... 454/187; 414/217.1; 414/935
(58) Field of Search .......................... 454/187; 414/935, 414/217, 217.1, 220

(56) References Cited

U.S. PATENT DOCUMENTS 5,997,398 A * 12/1999 Yamada et al. ............. 414/935
6,224,679 B1 * 5/2001 Sasaki et al. ................ 118/719

FOREIGN PATENT DOCUMENTS

| JP | 5-164361 | * 6/1993 |
| JP | 10-340874 | * 12/1998 |

* cited by examiner

Primary Examiner—Harold Joyce
(74) Attorney, Agent, or Firm—Pillsbury Winthrop LLP

(57) ABSTRACT

A semiconductor manufacturing apparatus ventilating system can reduce energy consumption with respect to air-conditioning and a power spent for transporting air in a clean room by minimizing an amount of circulating air in a clean room. The clean room air, which is supplied to the clean room, is introduced into an air circulating system including the semiconductor manufacturing apparatus. The air circulating system is separated from an atmosphere in the clean room. The clean room air in the air circulating system is circulated within the air circulating system.

8 Claims, 4 Drawing Sheets

VENTILATING METHOD AND VENTILATING SYSTEM FOR SEMICONDUCTOR MANUFACTURING APPARATUSES

BACKGROUND OF THE INVENTION

1. Field of the Invention

The present invention generally relates to ventilation of semiconductor manufacturing apparatuses and, more particularly, to a technique for ventilating semiconductor manufacturing apparatuses installed in a clean room.

2. Description of the Related Art

Generally, semiconductor manufacturing apparatuses are installed in a clean room in which temperature and humidity controlled clean air is circulated.

From among the semiconductor manufacturing apparatuses, a process apparatus or a peripheral apparatus, which handles a special gas such as a material gas, is provided with a casing such as a housing or an enclosure so that if gas leakage occurs, the leakage gas cannot spread into the clean room. Conventional semiconductor manufacturing apparatuses of this kind are provided with an air intake port on the casing and an exhaust port for exhausting air in the casing so as to continuously ventilate the interior of the casing by introducing the clean room air into the casing though the air intake port and exhausting the air in the casing from the exhaust port to an exhaust duct, which designed to match the characteristics of the special gas. According to such a structure of the casing and ventilating method, if gas leakage occurs in the apparatus, the leakage gas does not spread outside the casing, and is exhausted to the exhaust duct together with the clean room air, which has been drawn into the casing.

Additionally, semiconductor manufacturing apparatuses, which generate heat during operation, also have the same casing structure as the above-mentioned structure so as to continuously ventilate the interior of the casing by introducing the clean room air into the casing though the air intake port while exhausting the air in the casing from the exhaust port of the casing to a heat exhaust duct. In this case, the heat generated by the apparatus is discharged to the heat exhaust duct according to an air-cooling method using the clean room air as a cooling medium.

As mentioned above, in the conventional semiconductor manufacturing equipment, ventilation is performed by using the clean room air, which is clean and has a controlled temperature and humidity. The clean room air used for ventilation is a clean air that is produced by spending a large cost, and such a costly air is continuously dumped to the exhaust duct just in case of gas leakage and to release heat. Accordingly, in an air conditioning system of a clean room, a large amount of conditioned air must be supplied or replenished by using a large power for transporting air so as to maintain a pressure difference of the clean room, which causes a large load to the air conditioning system.

SUMMARY OF THE INVENTION

It is a general object of the present invention to provide an improved and useful ventilating method and ventilating system in which the above-mentioned problems are eliminated.

A more specific object of the present invention is to provide a ventilating system for semiconductor manufacturing apparatuses, which ventilating system can reduce energy consumption with respect to air-conditioning and a power spent for transporting air in a clean room by minimizing an amount of circulating air in a clean room.

Another object of the present invention is to provide a ventilating system for semiconductor manufacturing apparatuses, which ventilating system can reduce a load to special gas exhausting apparatus which treats special gasses handled by the semiconductor manufacturing apparatuses.

A further object of the present invention is to provide a ventilating system for semiconductor manufacturing apparatuses, which ventilating system can prevent gas leakage in a clean room.

In order to achieve the above-mentioned objects, there is provided according to the present invention a method for ventilating a semiconductor manufacturing apparatus installed in a clean room, the method comprising the steps of: introducing clean room air, which is supplied to the clean room, into an air circulating system including the semiconductor manufacturing apparatus, the air circulating system being separated from an atmosphere in the clean room; and circulating the clean room air within the air circulating system.

Additionally, there is provided according to the present invention a ventilating system for ventilating a semiconductor manufacturing apparatus installed in a clean room, the ventilating system comprising: a casing enclosing the semiconductor manufacturing apparatus in a substantially airtight state, the casing having an air intake port and an air exhaust port; and an air circulating system having a fan for circulating air within the air circulating system, an outlet of the fan being connected to the air intake port of the casing of the semiconductor manufacturing apparatus via a first air passage, an inlet of the fan being connected to the air exhaust port of the casing via a second air passage.

According to the present invention, the air for ventilation is supplied in a circulating manner to the casings of the substantially airtight casings of the semiconductor manufacturing apparatus to be ventilated by the air ventilating system that is separated from the atmosphere within the clean room. The air circulating system is provided with a fan, and the air discharged from the outlet of the fan is supplied to the casing of the semiconductor manufacturing apparatus by being passed through the first air passage. The air temporarily remains in the casing, and, thereafter, the air is introduced into the inlet of the fan by being passed through the second air passage so as to be discharged from the outlet of the fan again. Thus, the semiconductor manufacturing apparatus is ventilated within the air ventilating system, which is separated from the atmosphere in the clean room.

In order to effectively release heat generated in the apparatus to be ventilated, the ventilating method of the present invention may preferably control a temperature of the air exhausted from the casing and the temperature controlled air may be supplied to the casing. In order to achieve the temperature control function, the ventilating system of the present invention may preferably comprise a heat exchanger provided to the first air passage or the second air passage so as to control a temperature of the air in the air circulating system.

Additionally, in order to maintain each part of the air circulating system and air in the air circulating system to be clean and continuously maintain the interior of the casing of the apparatus to be ventilated, the ventilating method of the present invention may preferably clean the air discharged from the casing and supply the cleaned air to the casing. In order to achieve the cleaning function, the ventilating system of the present invention may preferably comprise an air cleaning filter provided to the first air passage or the second air passage.

Additionally, in the present invention, a pressure of the air in the air circulating system may be maintained at a constant value or within a predetermined range so as to maintain an amount or a pressure of the ventilating air in the casing. In order to achieve this, the ventilating method of the present invention may preferably discharge the air from the air ventilating system when the pressure of the air in the air circulating system is equal to or higher than an upper limit pressure. In order to achieve the pressure maintaining function, the ventilating system of the present invention may preferably comprise an air release passage and a relief valve provided to the air release passage, the air release passage having a first end and a second end opposite to the first end, the first end connected to one of the first and second air passages, the second end connected to an exhaust duct, the relief valve being opened to release the air in the air circulating system when a pressure in one of the first and second air passages is equal to or higher than the upper limit pressure.

Additionally, the ventilating method of the present invention may preferably comprises the steps of: detecting a pressure in the air circulating system; and replenishing the air circulating system with the clean room air when the pressure in the air circulating system is equal to or lower than a lower limit pressure. The step of replenishing may include the step of introducing the clean room air into the air circulating system until the pressure of the air in the air circulating system exceeds the lower pressure limit.

In order to achieve the above-mentioned pressure maintaining function, the ventilating system of the present invention may preferably comprise: pressure detecting means for detecting a pressure in the first air passage or the second air passage; and air replenishing means for replenishing the air circulating system with air supplied to the clean room when the pressure detected by the pressure detecting means is equal to or lower than the lower limit pressure. Additionally, the air replenishing means may comprise: an air introducing passage having a first end and a second end opposite to the first end, the first end connected to one of the first air passage and the second air passage, the second end being open to an atmosphere within the clean room; an open and close valve provided to the air introducing passage; and controlling means for controlling the open and close valve to open until the pressure detected by the pressure detecting means becomes higher than the lower limit pressure.

In the present invention, a load to the special exhaust apparatus for gas leakage is reduced by circulating the air within the air circulating system without assuming or supposing gas leakage of the apparatuses to be ventilated during a normal time. If gas leakage occurs, necessary safety measures are taken at the time the gas leakage occurs.

For the sake of safety measures when gas leakage occurs, the ventilating method of the present invention may preferably comprise the step of: detecting leakage of a predetermined gas handled by the semiconductor manufacturing apparatus to be ventilated based on the air exiting from the casing within the air circulating system; and discharging the air, which exits from the casing, from the air circulating system to a predetermined external exhaust system when leakage of the predetermined gas is detected. The step of discharging may include the step of diluting the air exiting from the casing by an inert gas.

In order to achieve the above-mentioned safety measure function, the ventilating system of the present invention may preferably comprise: gas detecting means provided to the second air passage for detecting leakage of a predetermined gas in the semiconductor manufacturing apparatus to be ventilated; a switching air passage having a first end and a second end opposite to the first end, the first end connected to the second air passage via a direction switching valve, the second end connected to an emergency exhaust duct; and direction controlling means responsive to a gas leakage detection signal provided by the gas detecting means for controlling the direction switching valve so as to direct the air exiting from the casing to the switching air passage. More preferably, the ventilating system may comprise: an emergency exhaust fan provided to the switching air passage; and fan controlling means responsive to the gas leakage detection signal provided from the gas detecting means for operating the emergency exhaust fan. Further, the ventilating system may preferably comprise: an inert gas supply source supplying an inert gas; an inert gas passage having a first end and a second end opposite to the first end, the first end connected to the inert gas supply passage, the second end connected to the switching air passage; an open and close valve provided to the inert gas passage; and valve control means responsive to the gas leakage detection signal provided by the gas detection means for opening the open and close valve.

It should be noted that the semiconductor manufacturing apparatus in the present invention can be an arbitrary apparatus installed in a clean room for manufacturing a semiconductor device, and includes not only a processing apparatus for applying a predetermined process to a substrate to be processed for manufacturing a semiconductor device but also various peripheral apparatuses relate to the process.

Other objects, features and advantages of the present invention will become more apparent from the scope of the present invention when read in conjunction with the accompanying drawings.

DETAILED DESCRIPTION OF THE PREFERRED EMBODIMENTS

A description will now be given, with reference to FIG. 1, of a first embodiment of the present invention.

Figure 1:
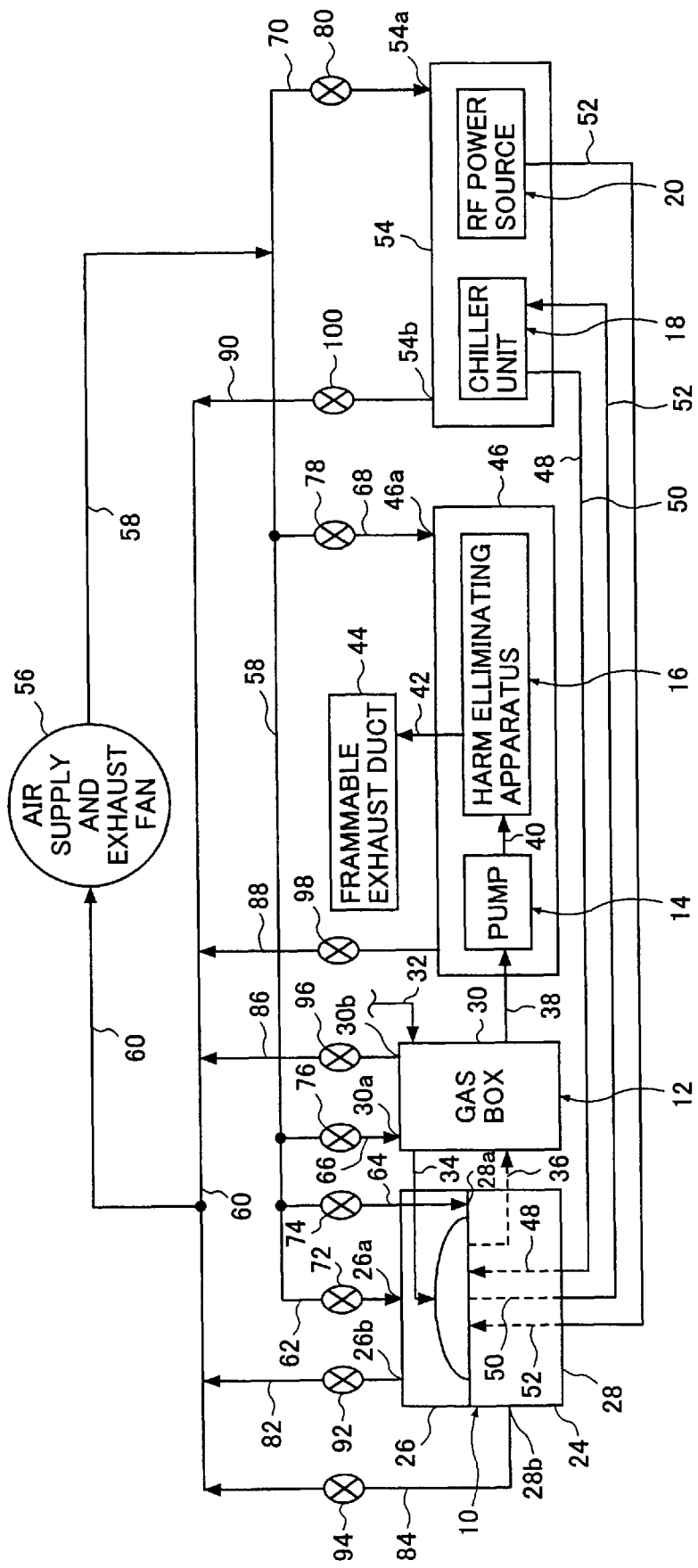
FIG. 1 is a block diagram of a basic structure of a ventilating system according to a first embodiment of the present invention.

FIG. 1 is a block diagram of a basic structure of a ventilating system according to a first embodiment of the present invention. Semiconductor manufacturing apparatuses to be ventilated in this embodiment includes a processing apparatus 10, a gas box 12, a pump 14, a harm eliminating apparatus 16, a chiller unit 18 and an RF power source 20. These apparatuses to be ventilated are installed in the same clean room or adjacent clean rooms so as to constitute a semiconductor manufacturing system with the processing apparatus as a center of the system.

The processing apparatus 10 is a single wafer type plasma etching apparatus using a special material gas. The processing apparatus 10 comprises a vacuum chamber 22, which accommodates a single substrate to be processed such as a semiconductor wafer (not shown in the figure) so as to apply a plasma etching process, and a machine chamber 24 which accommodates various mechanical elements or drive units related to the plasma etching.

In the present embodiment, the vacuum chamber 22 is accommodated in a casing 26 having a substantially airtight structure so that external air (clean room air) cannot enter the casing 26. A housing panel of the machine chamber 24 also has a casing 28 having a substantially airtight structure. The casing 26 is provided with an air intake port 26a and an air exhaust port 26b. Similarly, the casing 28 is provided with an air intake port 28a and an air exhaust port 28b.

The gas box 12 accommodates a material gas supply source used for a plasma etching process and a pressure adjusting unit and a flow adjusting unit for controlling a flow of an exhaust gas obtained as a result of the process. A material gas from the material gas supply source (not shown in the figure) enters the gas box 12 by passing through a pipe 32, and is supplied to the vacuum chamber 22 of the plasma etching apparatus 10 from the gas box 12 through a pipe 34. An exhaust gas exiting from the vacuum chamber 22 is flows through pipes 36 and 38, and is introduced into the vacuum pump 14.

The gas box 12 itself constitutes a casing 30 having a substantially airtight structure. The casing 30 is provided with an air intake port 30a and an air exhaust port 30b.

The vacuum pump 14 comprises a dry pump for example, and serves to depressurize the interior of the vacuum chamber 22 and exhaust a gas such as an unreacted material gas or a by-product gas. The exhaust gas exhausted from an outlet of the vacuum pump is supplied to the harm eliminating apparatus 16 by passing through a pipe 40. The harm eliminating apparatus 16 extracts and removes harmful substances from the exhaust gas sent from the vacuum pump 14. The exhaust gas exhausted from the harm eliminating apparatus 16 is sent to an exhaust duct corresponding to a nature of the exhaust gas. For example, if the exhaust gas is flammable, the flammable exhaust gas is sent to an exhaust duct 44 for collecting a flammable exhaust gas via a pipe 42 as indicated in the figure.

In the present embodiment, the vacuum pump 14 and the harm eliminating apparatus 16 are accommodated together in a casing having a substantially airtight structure. The casing is also provided with an air intake port 46a and an air exhaust port 46b.

The chiller unit 18 supplies a coolant for cooling a substrate to be cooled to a periphery of a susceptor (not shown in the figure) provided in the vacuum chamber 22 of the plasma etching apparatus 10 via pipes 48 and 50. The RF power source 20 supplies an RF power for generating plasma to the susceptor in the vacuum chamber 22 via an electric cable 52.

In this embodiment, the chiller unit 18 and the RF power source 20 are accommodated together in a casing 54 having a substantially airtight structure. The casing 54 is also provided with an air intake port 54a and an air exhaust port 54b.

It should be noted that each of the casings 26, 28, 30, 46 and 54 of the apparatuses 10–20 to be ventilated are not always be maintained in an airtight state, and a door, a lid, a drawer, a glass window or a meter may be mounted if necessary.

In the present embodiment, a ventilation air is supplied, in a circulated manner, from an air circulating system, which is isolated from an atmosphere in the clean room, to each of the casings 26, 28, 30, 46 and 54 of the apparatuses 10–20 to be ventilated. The air circulating system is provided with an electric fan 56 used for air supply and also exhaust, and the fan 56 is connected to each of the casings 26, 28, 30, 46 and 54 of the apparatuses 10–20 to be ventilated via pipes that can withstand a positive pressure.

More specifically, the outlet and inlet of the air supply and exhaust fan 56 are connected to a main air supply pipe 58 and a main air exhaust pipe 60, respectively. The main air supply pipe 58 is connected to the air intake ports 26a, 28a, 30a, 46a and 54a of the casings 26, 28, 30, 46 and 54 of the apparatuses 10–20 to be ventilated via branch air supply pipes 62, 64, 66, 68 and 70, respectively. Air supply dampers 72, 74, 76, 78 and 80 are mounted to the branch air supply pipes 62, 64, 66, 68 and 70, respectively.

On the other hand, the main air exhaust pipe 60 is connected to the air exhaust ports 26b, 28b, 30b, 46b and 54b of the casings 26, 28, 30, 46 and 54 of the apparatuses 10–20 to be ventilated via branch air exhaust pipes 82, 84, 86, 88 and 90, respectively. Air exhaust dampers 92, 94, 96, 98 and 100 are mounted to the branch air exhaust pipes 82, 84, 86, 88 and 90, respectively.

In the air circulating system, the air supply and exhaust fan 56 is continuously operated at a constant rotational speed. The air delivered from the outlet of the fan 56 is distributed from the main air supply pipe 58 to each of the branch air supply pipes 62, 64, 66, 68 and 70, and is consequently supplied to the casings 26, 28, 30, 46 and 54 via the respective air intake ports 26a, 28a, 30a, 46a and 54a. A pressure of the air supplied to each of the casings 26, 28, 30, 46 and 54 can be adjusted by the respective one of the air supply dampers 72, 74, 76, 78 and 80.

The air supplied to each of the casings 26, 28, 30, 46 and 54 is temporarily remain, and, thereafter, exhausted to each of the branch air exhaust pipes 82, 84, 86, 88 and 90 from the respective one of the air exhaust ports 26b, 28b, 30b, 46b and 54b. A pressure of the air exhausted from each of the casings 26, 28, 30, 46 and 54 can be adjusted by the respective one of the air exhaust dampers 92, 94, 96, 98 and 100.

A clean air of which temperature and humidity is controlled is supplied to the clean room from a ceiling thereof through a dust removing filter according to a down flow, and the supplied air flows down and passes through a grating of a room floor for circulation without being substantially taken into each of the casings 26, 28, 30, 46 and 54 of the apparatuses 10–20 to be ventilated.

As mentioned above, according to the ventilating method of the present invention, the semiconductor manufacturing apparatuses 10–20 are ventilated basically by the air circulating system which does not use the air flowing in the clean room. Accordingly, an amount of air circulated in the clean room is minimized, and an energy consumed by the air conditioning and air transportation in the clean room can be greatly reduced.

A description will now be given, with reference to FIGS. 2 to 4, of a second embodiment of the present invention to which various functions are added.

Figure 2:
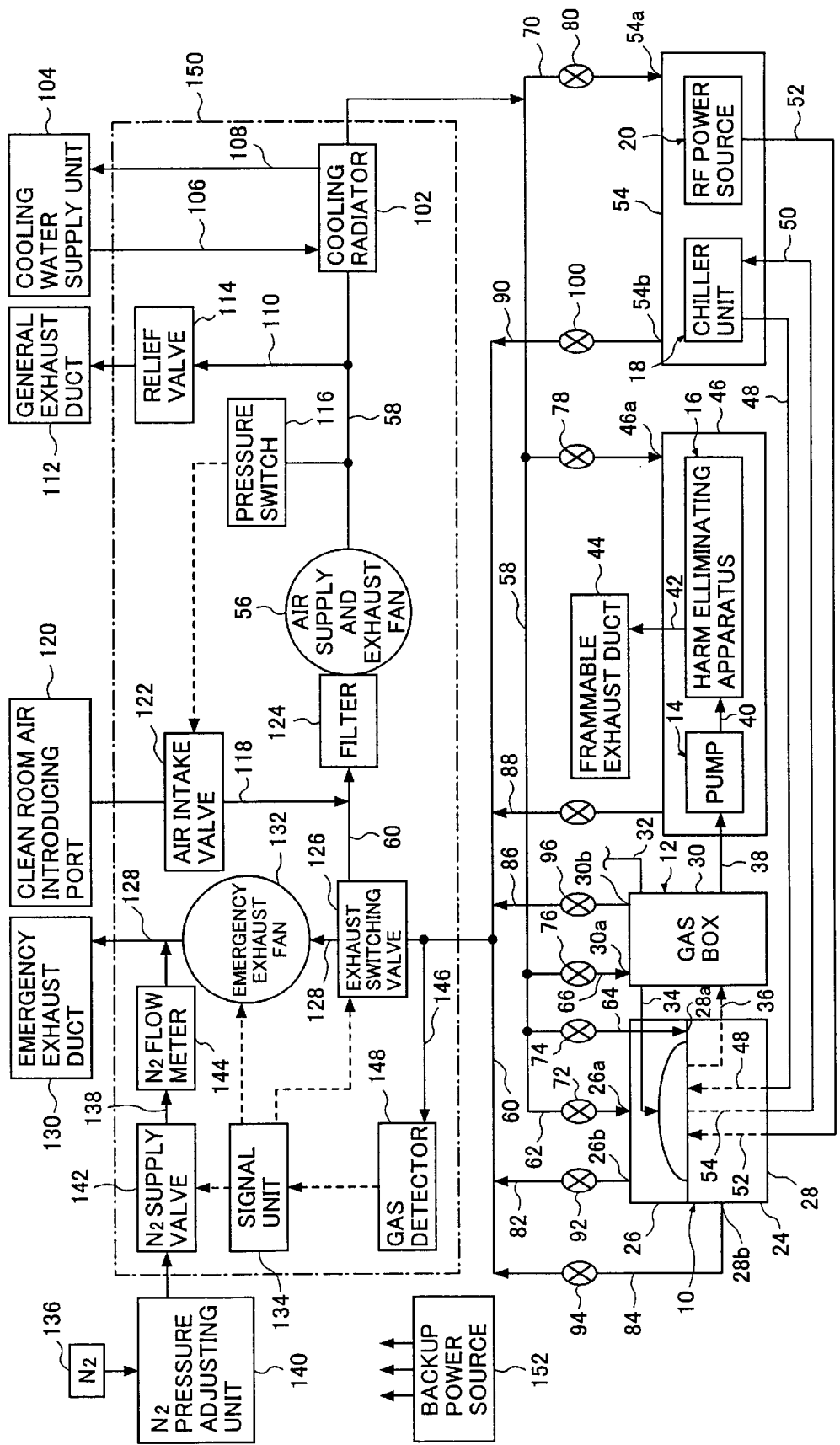
FIG. 2 is a block diagram of a ventilating system according to a second embodiment of the present invention.

FIG. 2 is a block diagram of a ventilating system according to the second embodiment of the present invention. FIG. 3 is a perspective view of a part of the ventilating system according to the second embodiment of the present invention. FIG. 4 is a perspective view of a control system of the ventilating system shown in FIG. 2. It should be noted that in FIGS. 2 to 4, parts that are substantially the same as the parts shown in FIG. 1 are give the same reference numerals.

In FIG. 2, a cooling radiator 102 is provided to the main air supply pipe 58. The cooling radiator 102 is a water cooling type heat exchanger, which controls a temperature of air flowing through the main air supply pipe 58 by a cooling water of a constant temperature, for example, 20° C., supplied by a cooling water supply unit 104 via pipes 106 and 108. In this manner, the air of a predetermined temperature is supplied from the air supply pipes 58 and 62–70 to each of the casings 26, 28, 30, 46 and 54 of the apparatuses 10–20.

The air having a raised temperature by absorbing heat generated in each of the casings 26, 28, 30, 46 and 54 is collected by the air supply and exhaust fan 56 via the exhaust pipes 82–90, and is returned to the predetermined temperature by the cooling radiator 102.

As mentioned above, the air circulating system absorbs heat generated in each of the apparatuses 10–20 within the respective casings 26, 28, 30, 46 and 54, and releases the heat in the cooling radiator 102.

Further, the main air supply pipe 58 is connected to a general exhaust duct 112 via a pipe 110 between the air supply and exhaust fan 56 and the cooling radiator 102, and the pipe 110 is provided with a relief valve 114. When a pressure in the main air supply pipe 58 is equal to or higher than a first predetermined setting pressure (upper limit pressure), the relief valve 114 is open so as to release the air in the main air supply pipe 58 to the general exhaust duct 112. According to such a function to release or reduce the air, the pressure of the air supplied to each of the apparatuses 10–20 can be maintained below the upper limit pressure.

It should be noted that the pressure of the circulating air in the air circulating system can be set to an arbitrary value. However, it is preferable to maintain the pressure to be lower than the pressure of the air in the clean room so that the air circulating within the air circulating system is prevented from exiting the casings even though the air in the clean room may enter the casings.

Additionally, if a pressure in the main air supply pipe 58 between the air supply and exhaust fan 56 and the cooling radiator 102 is equal to or lower than a second predetermined setting pressure (lower limit pressure), a pressure switch 116 outputs a predetermined signal. An end of a pipe 118 is connected to the main air exhaust pipe 60, and the other end of the pipe 118 is open to the clean room atmosphere so as to form an air intake port 120. The pipe 118 is provided with an air intake valve 122 which comprises an air-operated valve so that the air in the clean room is taken into the air circulating system through the pipe 118 by opening the valve 122 in response to the signal from the above mentioned pressure switch 116. If the pressure in the main air supply pipe 58 becomes higher than the lower limit pressure, the output signal of the pressure switch 116 is stopped, and, thereby, the valve 122 is closed.

As mentioned above, if an amount of air circulated in the air circulating system, especially an amount of air supplied to the casing becomes insufficient due to variation with age or adjustment by the dampers, a necessary amount of air in the clean room is introduced into the air circulating system so as to replenish the air in the air circulating system.

An air cleaning filter such as a dust removing filter 124 is provided to the main exhaust pipe 60 before the inlet of the air supply and exhaust fan 56. Dust generated in the pipes or casings 26, 28, 30, 46 and 54 in the air circulating system is transported to the dust removing filter 124 together with the exhaust gas, and is removed by the dust removing filter 124. As mentioned above, each part of the air circulating system and the air circulating in the air circulating system are continuously maintained clean, and the interior of each of the casings 26, 28, 30, 46 and 54 is also maintained clean.

It should be noted that as for the air cleaning filter 124, a low pressure-loss type filter is preferably used so that a pressure difference between the outlet and inlet of the air supply and exhaust fan 56. Additionally, it is possible to use another filter alone or with the air cleaning filter 124 which removes chemical substances from the circulating air exhausted and collected from the casings.

On the upstream side of the air cleaning filter 124, the main air exhaust pipe 60 is connected to an emergency exhaust duct 130 via a pipe 128 and an exhaust switching valve (three-way valve) 126, which comprises an air-operated valve. The pipe 128 is provided with an electric fan 132 for emergency exhaust. The emergency exhaust fan 132 is controlled by a signal unit (sequencer) 134 so that the fan is stopped when the system is in a normal condition and is operated when gas leakage occurs in any one of the apparatuses 10–20 to be ventilated.

Additionally, a gas supply source 136 of an inert gas for dilution such as nitrogen gas ($N_2$) is connected to the pipe 128 on the downstream side of the electric fan 132 via a pipe 138, and the pipe 138 is provided with a pressure adjusting unit 140, a dilution gas supply valve 142 and a flow meter 144 in that order from the upstream side to the downstream side. The dilution gas supply valve 142 comprises an air-operated valve, and is controlled by the signal unit 134 so as to be closed during a normal time and open when gas leakage occurs in any one of the apparatuses 10–20 to be ventilated.

On the upstream side of the exhaust switching valve 126, a gas detector 148 is connected to the main air exhaust pipe 60 via a gas sampling port 146. The gas detector 148 comprises a single or a plurality of gas sensors for detecting one or a plurality of kinds of gasses handled by the apparatuses 10–20 to be ventilated. When leakage gas is contained in the circulating air exhausted or collected from the apparatuses 10–20 to be ventilated, the corresponding gas sensor detects the leakage gas, and the gas detector outputs a gas leakage detection signal.

Upon receipt of the gas leakage detection signal from the gas detector 148, the signal unit 134 switches the outlet of the exhaust switching valve to the pipe 128 and has the emergency exhaust fan 132 to start and switches the dilution gas supply valve 142 to an open state. Thereby, the air collected from the casings 26, 28, 30, 46 and 54 of the apparatuses 10–20 to be ventilated is transferred to the pipe 128, and is transferred to the emergency exhaust duct 130 after being diluted by a predetermined flow of an inert gas ($N_2$ gas) in the middle of the pipe 128. It should be noted that a harm eliminating apparatus (not shown in the figure) may be provided to the emergency exhaust duct 130.

After the emergency exhaust system for gas leakage is operated, an air from the main air exhaust pipe 60 is stopped by the exhaust switching valve 126 near the main air supply and exhaust fan 56, and, thereby, the air in the clean room is taken into the air circulating system thorough the pipe 118 by the operations of the pressure switch 116 and the air intake valve 122. The intake air is supplied to the casings 26, 28, 30, 46 and 54 of the apparatuses to be ventilated by the air supply and exhaust fan 56 via the air supply pipes 58 and 62–70. It should be noted that an alarming means may be provided to the signal unit 134 so as to announce to operators by outputting a predetermined abnormal alarm when gas leakage occurs.

As mentioned above, in the air circulating system, when a normal time, the air for circulation is circulated without assuming or supposing gas leakage of the apparatuses 10–20 to be ventilated. Then, when gas leakage occurs in any one of the apparatuses 10–20 to be ventilated, the above-mentioned emergency exhaust system is activated so as to immediately and safely exhaust the circulating air containing the leakage gas to the emergency exhaust duct 130, and take the air in the clean room so as to continue the ventilation of the apparatuses 10–20 to be ventilated. Accordingly, the when the normal time, there is no need to operate the exhaust system for gas leakage or the harm eliminating apparatus, and there is no need to have the air conditioning apparatus of the clean room to consume a power for transporting air. Thus, a load to the external relating apparatuses and an energy consumed by the external relating apparatuses can be minimized.

A buffer power source 152 shown in FIG. 2 is connected to each part using an electric power in the semiconductor manufacturing system and the air circulating system according to the present embodiment so as to supply a necessary power to each part to continue an operation of the system when a supply of power is stopped due to a power failure of the commercially available power source.

In the embodiment shown in FIG. 2, elements of the control system of the air circulating system are accommodated together within a casing 150 that is placed on the process apparatus 10. It is preferable that the casing 150 also has a substantially airtight structure. Additionally, the unit in the casing 150 may be accommodated in one of the apparatuses to be ventilated. In such as case, the casing 150 is provided with an air intake port and an air exhaust port so as to connect the air intake port and the air exhaust port to the main air supply pipe 58 and the main air exhaust pipe 60 via pipes, respectively.

Figure 3:
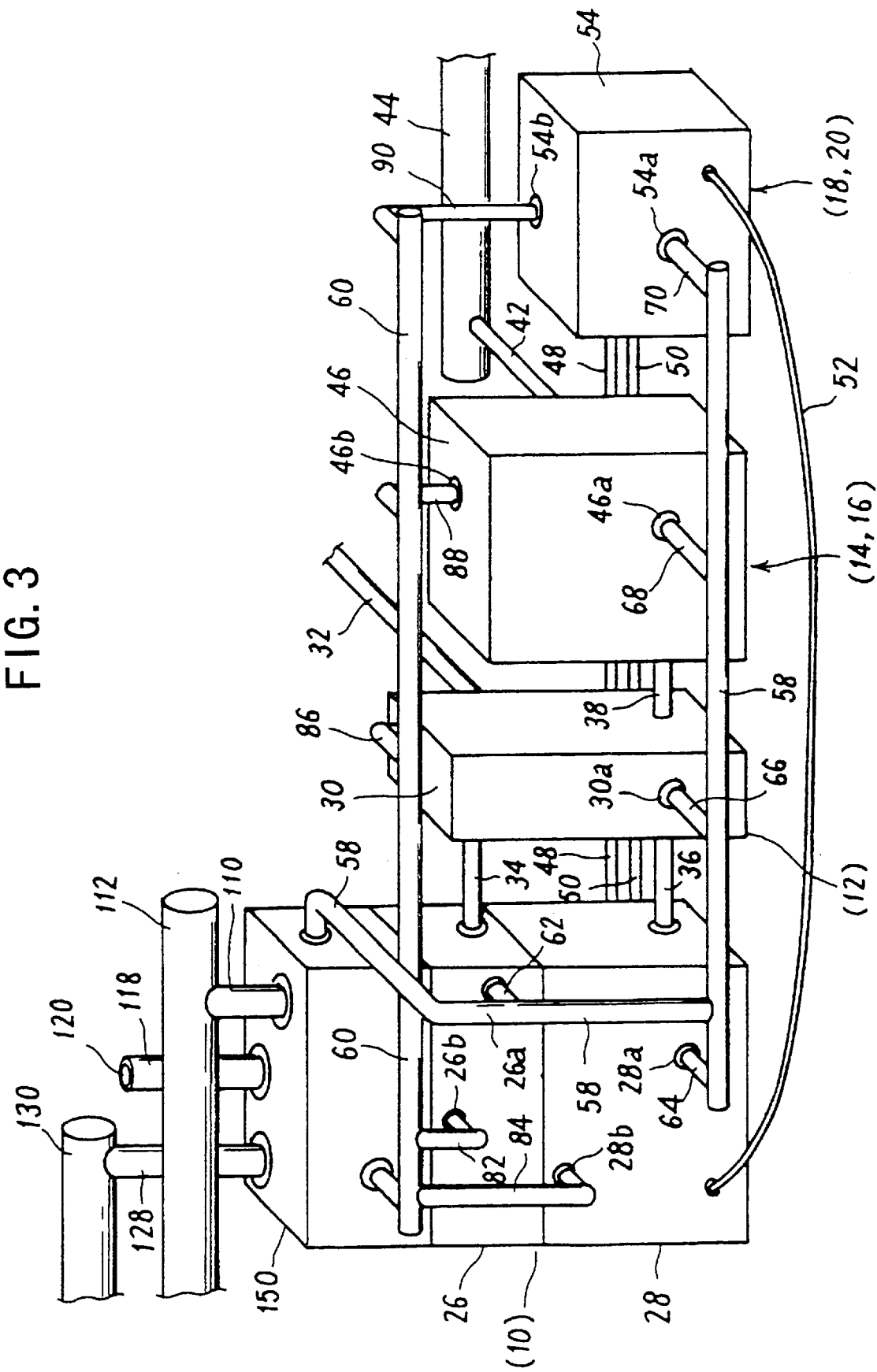
FIG. 3 is a perspective view of a part of the ventilating system according to the second embodiment of the present invention.
Figure 4:
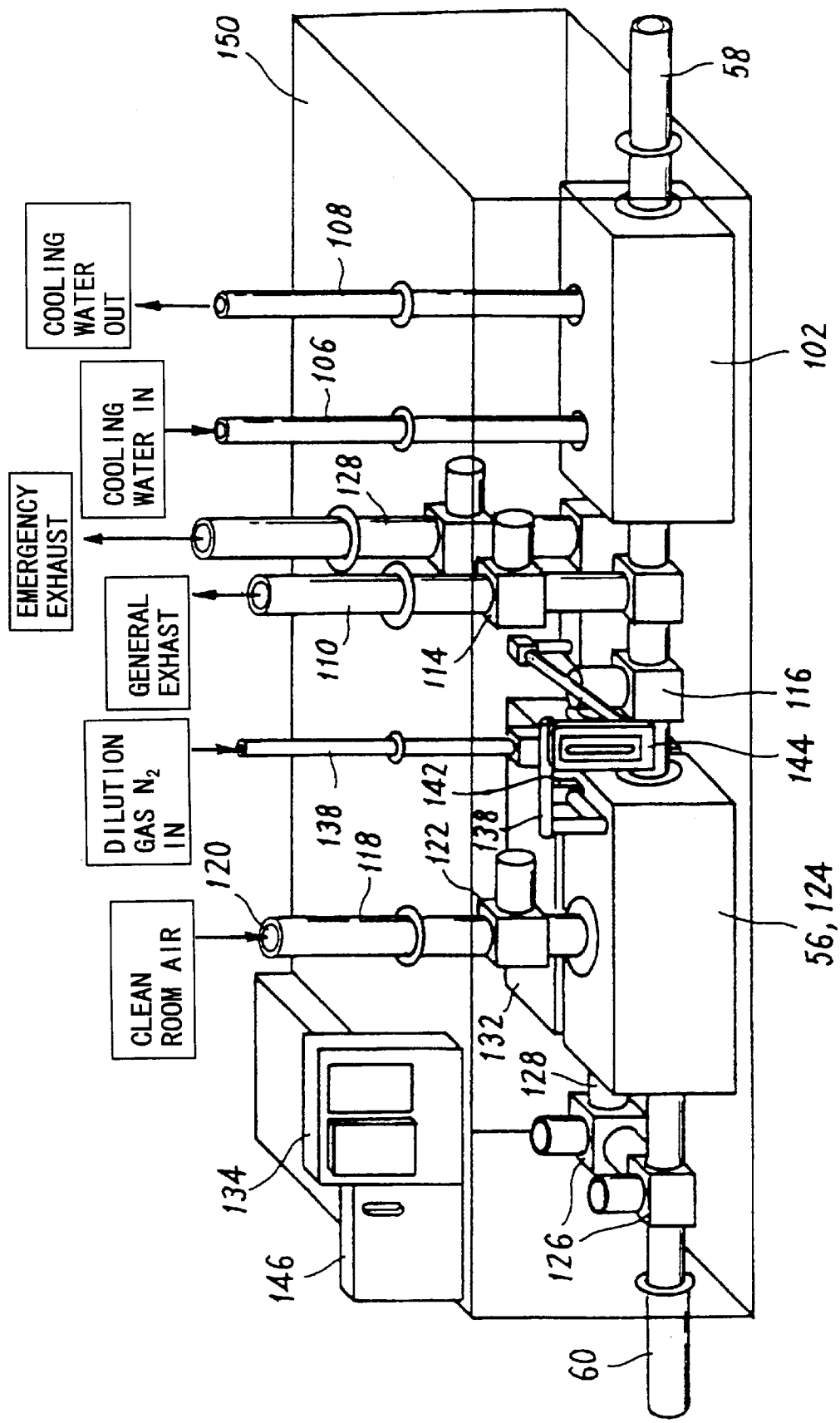
FIG. 4 is a perspective view of a control system of the ventilating system shown in FIG. 2.

It should be noted that, in FIG. 3, the air supply dampers 72–80 and 92–100 and pipes 106, 108 and 138 are omitted for the sake of simple illustration of the entire system.

The present invention is not limited to the specifically disclosed embodiments, and variations and modifications may be made without departing from the scope of the present invention. For example, the kinds of the apparatuses to be ventilated are not limited to those explained in the above-mentioned embodiments, and various modification may be made. The structure of the casings of the apparatuses to be ventilated is not limited to the housing structure as shown in the figure, and arbitrary shape, material and form may be used.

In the air circulating system of the present invention, a type, a position for mount and a number of the fans, especially the air supply and exhaust fan can be arbitrarily selected, and a revolution speed of the fan may be variably controlled in response to various conditions.

In the above-mentioned embodiments, a plurality of apparatuses to be ventilated are connected parallel to each other to the air supply and exhaust fan 56 or the main air supply pipe 58 via the branch air supply pipes 62–70. According to such a parallel ventilating method, the apparatuses 10–20 to be ventilated can be ventilated separately from each other, and the characteristic (flow and pressure) of air supply and/or air exhaust can be controlled on an individual apparatus basis. However, in order to provide a simple piping structure, it is possible to select a serial ventilating method in which a plurality of apparatuses to be ventilated are connected in series to the air supply and exhaust fan 56. Alternatively, the parallel ventilating method and the serial ventilating method may be combined.

The present application is based on Japanese Priority Application No. 11-362156, filed on Dec. 21, 1999, the entire contents of which are hereby incorporated by reference.

What is claimed is:

1. A ventilating system for ventilating a semiconductor manufacturing apparatus installed in a clean room, the ventilating system comprising:

a casing constructed and arranged for enclosing said semiconductor manufacturing apparatus in a substantially airtight state, said casing having an air intake port and an air exhaust port;

an air circulating system having a fan for circulating air within said air circulating system, an outlet of said fan being connected to said air intake port of said casing of said semiconductor manufacturing apparatus via a first air passage, an inlet of said fan being connected to said air exhaust port of said casing via a second air passage;

gas detecting means provided to said second air passage for detecting leakage of a predetermined gas in said semiconductor manufacturing apparatus;

a switching air passage having a first end and a second end opposite to said first end, said first end connected to said second air passage via a direction switching valve, said second end connected to an emergency exhaust duct; and direction controlling means responsive to a gas leakage detection signal provided by said gas detecting means for controlling said direction switching valve so as to direct the air exiting from said casing to said switching air passage.

2. The ventilating system as claimed in claim 1, further comprising:

a heat exchanger provided to one of said first and second air passages so as to control a temperature of the air circulating in said air circulating system to be a predetermined temperature.

3. The ventilating system as claimed in claim 1, further comprising an air filter associated with one of said first and second air passages so as to clean the air circulating in said air circulating system.

4. The ventilating system as claimed in claim 1, further comprising:

an air release passage having a first end and a second end opposite to said first end, said first end being connected to one of said first and second air passages, said second end being connected to an exhaust duct; and a relief valve provided to said air release passage, said relief valve opening to release the air in said air circulating system when a pressure in one of said first and second air passages is equal to or higher than an upper limit pressure.

5. The ventilating system as claimed in claim 1, further comprising:

pressure detecting means for detecting a pressure in one of said first and second air passages; and air replenishing means for replenishing said air circulating system with air supplied to said clean room when the pressure detected by said pressure detecting means is equal to or lower than a lower limit pressure.

6. The ventilating system as claimed in claim 5, wherein said air replenishing means comprises:
- an air release passage having a first end and a second end opposite to said first end, said first end connected to one of said first and second air passages, said second end being open to an atmosphere within said clean room;
- an open and close valve provided to said air release passage; and
- valve controlling means for controlling said open and close valve to open until the pressure detected by said pressure detecting means becomes higher than said lower limit pressure.

7. The ventilating system as claimed in claim 1, further comprising:
- an emergency exhaust fan provided to said switching air passage; and
- fan controlling means responsive to the gas leakage detection signal provided from said gas detecting means for operating said emergency exhaust fan.

8. The ventilating system as claimed in claim 1, further comprising:
- an inert gas supply source supplying an inert gas;
- an inert gas passage having a first end and a second end opposite to said first end, said first end connected to said inert gas supply source, said second end connected to said switching air passage;
- an open and close valve provided to said inert gas passage; and
- valve control means responsive to the gas leakage detection signal provided by said gas detection means for opening said open and close valve.

* * * * *